United States Patent
Lee et al.

(10) Patent No.: US 8,045,361 B2
(45) Date of Patent: Oct. 25, 2011

(54) NON-VOLATILE MEMORY CELL WITH COMPLEMENTARY RESISTIVE MEMORY ELEMENTS

(75) Inventors: Hyung-Kyu Lee, Edina, MN (US); YoungPil Kim, Eden Prairie, MN (US); Chulmin Jung, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 34 days.

(21) Appl. No.: 12/501,140

(22) Filed: Jul. 10, 2009

(65) Prior Publication Data
US 2010/0091549 A1    Apr. 15, 2010

Related U.S. Application Data

(60) Provisional application No. 61/104,072, filed on Oct. 9, 2008.

(51) Int. Cl.
*G11C 11/00* (2006.01)
(52) U.S. Cl. ........ 365/148; 365/158; 365/163; 365/171; 365/173
(58) Field of Classification Search .................. 365/148, 365/158, 163, 171, 173
See application file for complete search history.

(56) References Cited

U.S. PATENT DOCUMENTS

| | | | |
|---|---|---|---|
| 6,396,735 B2 * | 5/2002 | Michijima et al. | 365/173 |
| 6,965,533 B2 | 11/2005 | Sakata et al. | |
| 7,245,522 B2 | 7/2007 | Aoki | |
| 7,408,212 B1 * | 8/2008 | Luan et al. | 257/295 |
| 7,436,698 B2 | 10/2008 | Lin et al. | |
| 2003/0142527 A1 * | 7/2003 | Yamada | 365/63 |
| 2004/0184331 A1 * | 9/2004 | Hanzawa et al. | 365/203 |
| 2005/0110117 A1 * | 5/2005 | Hsu | 257/536 |
| 2006/0109316 A1 * | 5/2006 | Nagao et al. | 347/62 |
| 2006/0267573 A1 * | 11/2006 | Horii et al. | 324/97 |
| 2009/0129143 A1 * | 5/2009 | Guo et al. | 365/158 |
| 2009/0161413 A1 * | 6/2009 | Yoon et al. | 365/158 |

OTHER PUBLICATIONS

David Tawei Wang, "Modern DRAM Memory Systems; Performance Analysis and Scheduling Algorithm," Ph.D thesis, University of Maryland, 2005 pp. 1-40, US.

* cited by examiner

*Primary Examiner* — Huan Hoang
*Assistant Examiner* — Jay Radke
(74) *Attorney, Agent, or Firm* — Fellers, Snider, et al.

(57) ABSTRACT

A non-volatile memory cell and method of writing data thereto. In accordance with some embodiments, the memory cell includes first and second resistive memory elements (RMEs) configured to concurrently store complementary programmed resistive states. The first RME is programmed to a first resistive state and the second RME is concurrently programmed to a second resistive state by application of a common write current in a selected direction through the memory cell.

20 Claims, 4 Drawing Sheets

NON-VOLATILE MEMORY CELL WITH COMPLEMENTARY RESISTIVE MEMORY ELEMENTS

RELATED APPLICATION

The present application makes a claim of domestic priority under 35 U.S.C. §119(e) to U.S. Provisional Patent Application No. 61/104,072 filed Oct. 9, 2008.

BACKGROUND

Data storage devices can be used to store and retrieve user data in a fast and effective manner. Some data storage devices utilize a semiconductor array of solid-state memory cells to store data. The memory cells can be volatile or non-volatile. Some non-volatile memory cells can be provided with a 1T1R configuration with a single transistor ("T") and a single programmable resistive memory element ("R").

The resistive memory element is programmable to different resistive states through the application of write currents to the memory cell, and these different resistive states can be used to denote different logical states (e.g., logical 0, 1, 10, etc.). The programmed state of the resistive memory element can be sensed by application of a read current to the memory cell, and a comparison of the voltage drop across the cell with a reference voltage using a sense amplifier. The memory cell transistor serves as a switching device to facilitate access to the memory cell during write and read operations, and to decouple the memory cell from adjacent cells at other times.

A number of resistive memory element (RME) constructions are known, including without limitation magnetic random access memory (MRAM), spin-torque transfer random access memory (STRAM), resistive random access memory (RRAM), phase change random access memory (PCRAM), and programmable metallic cells (PMCs). While operable, a limitation with these and other RME constructions relates to difficulties in reliably sensing the different resistive states to which the cells are programmed. Significant portions of the available semiconductor area may be allocated for circuitry used during read and write operations. This increased overhead can limit overall data storage densities for a given semiconductor size.

SUMMARY

Various embodiments of the present invention are directed to a non-volatile memory cell and a method of writing data thereto.

In accordance with some embodiments, the non-volatile memory cell includes first and second resistive memory elements (RMEs) configured to concurrently store complementary programmed resistive states. The first RME is programmed to a first resistive state and the second RME is concurrently programmed to a second resistive state by application of a common write current through the memory cell.

In accordance with other embodiments, the method generally comprises providing a non-volatile memory cell comprising first and second resistive memory elements (RMEs) configured to concurrently store complementary programmed resistive states. A common write current is applied through the memory cell to concurrently program the first RME to a first resistive state and the second RME to a second resistive state.

These and other features and advantages which characterize the various embodiments of the present invention can be understood in view of the following detailed discussion and the accompanying drawings.

DETAILED DESCRIPTION

Figure 1:
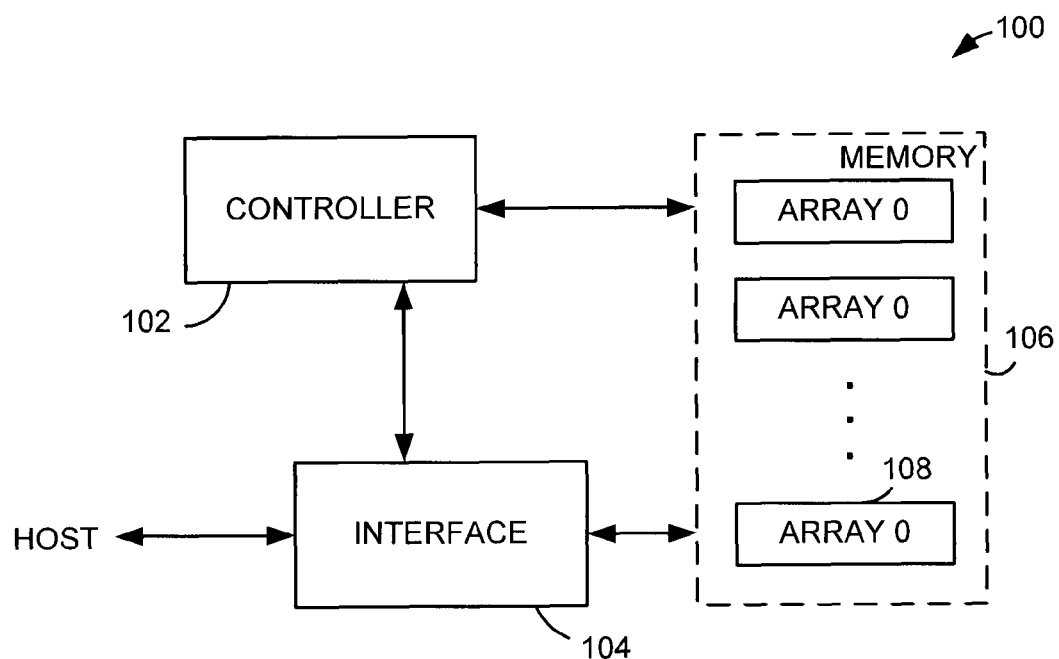
FIG. 1 shows an exemplary data storage device in accordance with various embodiments of the present invention.

FIG. 1 provides a functional block representation of a data storage device 100 constructed and operated in accordance with various embodiments of the present invention. Top level control of the device 100 is carried out by a suitable controller 102, which may be a programmable or hardware based microcontroller. The controller 102 communicates with a host device via a controller interface (I/F) circuit 104. A memory space 106 comprises a number of memory arrays 108 (denoted Array 0-N). Each array 108 comprises a block of semiconductor memory of selected storage capacity.

Figure 2:
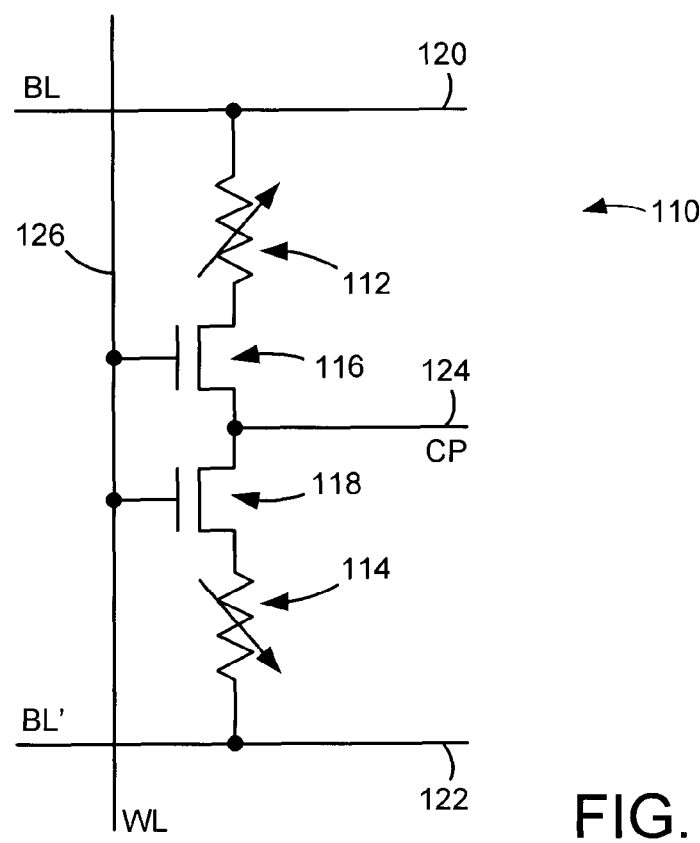
FIG. 2 is a schematic depiction of a memory cell of the device of FIG. 1.

FIG. 2 shows an exemplary construction for a memory cell 110 of the memory space 106 of FIG. 1. The memory cell 110 has a complementary 2T2R configuration, with first and second resistive memory elements (RMEs) 112, 114 and first and second switching devices 116, 118. In some embodiments, the switching devices 116 and 118 are characterized as n-channel metal oxide semiconductor field effect transistors (NMOSFETs).

The RMEs 112, 114 are each selectively programmable to different resistive states, such as a high resistance or a low resistance. The programmed states are complementary in that when the first RME 112 is programmed high, the second RME 114 is concurrently programmed low, and vice versa. As explained below, this cell configuration facilitates improved sensing margin and enhanced data transfer rate performance including high data rate page-mode read operations.

An overall memory state of the cell 110 can be determined in relation to the programmed state of the first RME 112; for example, the memory cell 110 may be identified as storing a logical 0 when the first RME 112 is programmed to the low resistance and the second RME 114 is programmed to the high resistance. The memory cell 110 may be alternatively identified as storing a logical 1 when the first RME 112 is programmed to the high resistance and the second RME 114 is programmed to the low resistance.

The memory cell 110 is connected between complementary bit lines 120, 122 denoted BL and BL'. A cell plate (CP) line 124 is provided between the cell transistors 116, 118. A word line (WL) 126 is connected to respective control gates of the transistors 116, 118.

Figure 3:
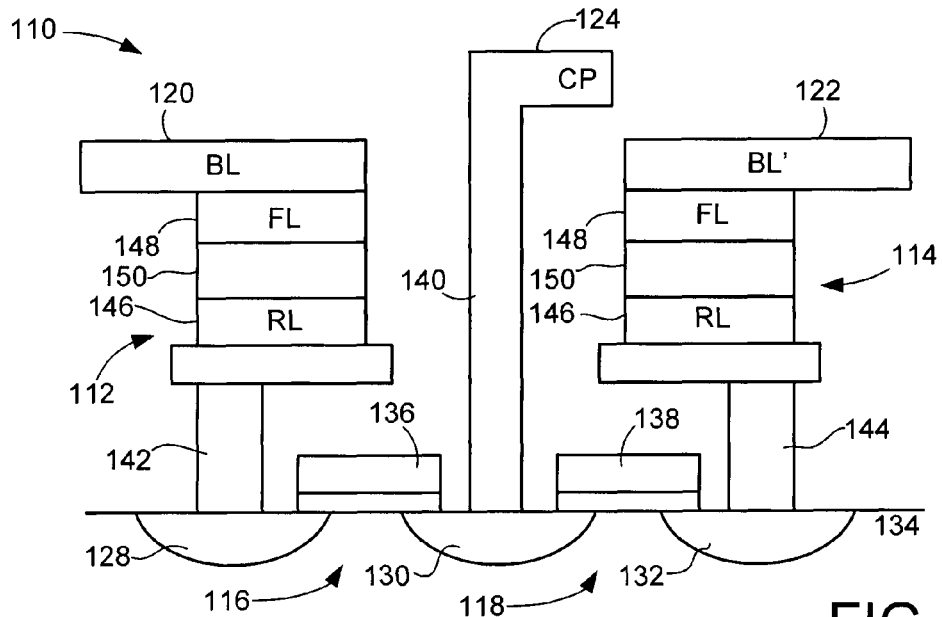
FIG. 3 provides an elevational representation of the memory cell of FIG. 2.

FIG. 3 shows an elevational semiconductor representation of the memory cell 110 of FIG. 2 in accordance with some embodiments. It will be appreciated that other cell configurations can be used as desired. Regions of n+ doped material 128, 130 and 132 are formed in a semiconductor substrate 134. Isolated control gates 136, 138 span adjacent pairs of the doped regions to form the first and second transistors 116, 118.

A support structure 140 establishes the aforementioned CP line connection with the middle doped region 130. Support structures 142 and 144 respectively support and interconnect the first and second RMEs 112, 114 with the regions 128 and 132.

The first and second RMEs 112, 114 are characterized in FIG. 3 as magnetic tunneling junctions (MTJs) of a spin-torque transfer random access memory (STRAM). Each MTJ includes a fixed reference layer (RL) 146 and a free layer (FL) 148 separated by an intervening tunneling barrier layer 150. Each reference layer 146 has a fixed magnetic orientation in a selected direction, such as via pinning to a separate permanent magnet layer (not shown).

The free layers 148 each have a variable magnetic orientation that can be aligned in the same direction as the associated reference layer 146 (parallel) or in an opposing direction as the associated reference layer 146 (anti-parallel). The MTJs will have a low resistance in the parallel state and a high resistance in the anti-parallel state. These respective states can be obtained by passing write currents of suitable magnitude and pulse width through the MTJs in opposing (bipolar) directions.

While the RMEs 112, 114 have been characterized as MTJs in FIG. 3, it will be appreciated that such is exemplary and not limiting. Other RME configurations can readily be used including but not limited to MRAM, RRAM, and PMC structures. Suitable RME configurations can include structures that are programmable to different states with the application of bipolar write currents. The first RME 112 can be provided with the same physical orientation within the cell as the second RME 114, as shown in FIG. 3, or the RMEs can be provided with opposing physical orientations.

Figure 4:
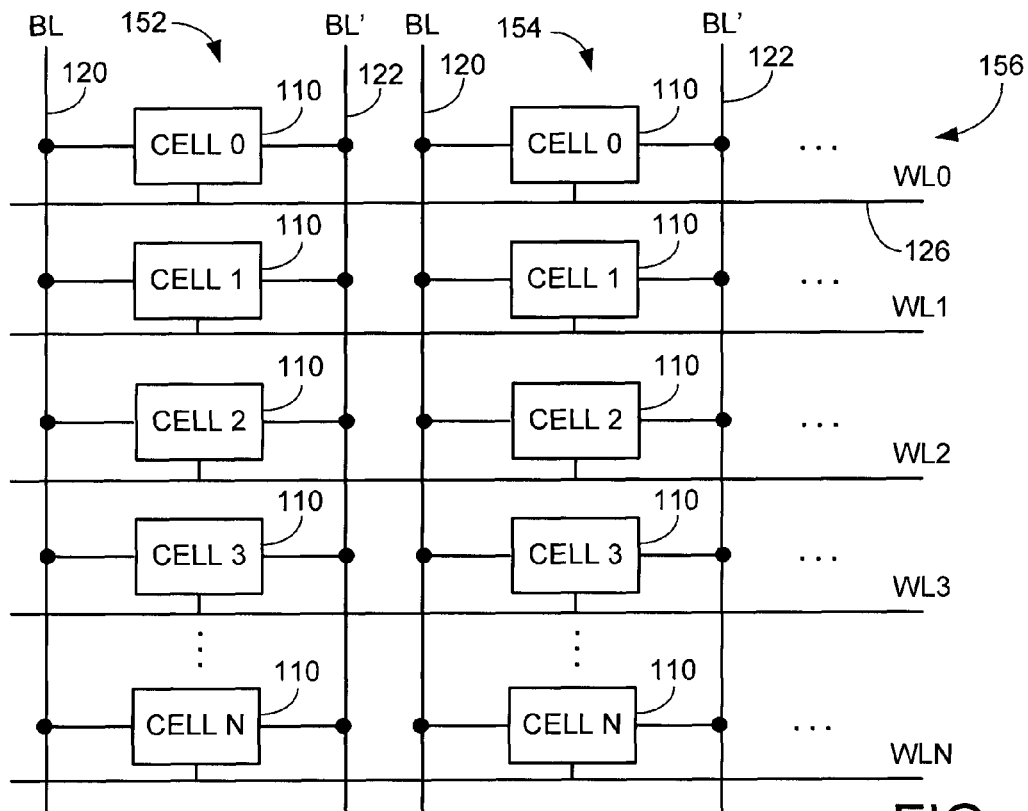
FIG. 4 shows the memory cells of FIGS. 2-3 arranged into rows and columns.

In some embodiments, the memory cells 110 are arranged into columns of memory cells in the array 108. Two such columns are identified at 152 and 154 in FIG. 4. Each column is connected between adjacent, complementary bit lines BL 120 and BL' 122, and includes a selected number of memory cells 0-N.

Adjacent memory cells 110 in the respective columns 152, 154 form rows 156 of selected length. The cells along each row 156 are coupled to a separate word line 126, denoted WL0 to WLN in FIG. 4. Each row 156 of cells will be referred to herein as a page of memory, although such is not limiting.

Figure 5:
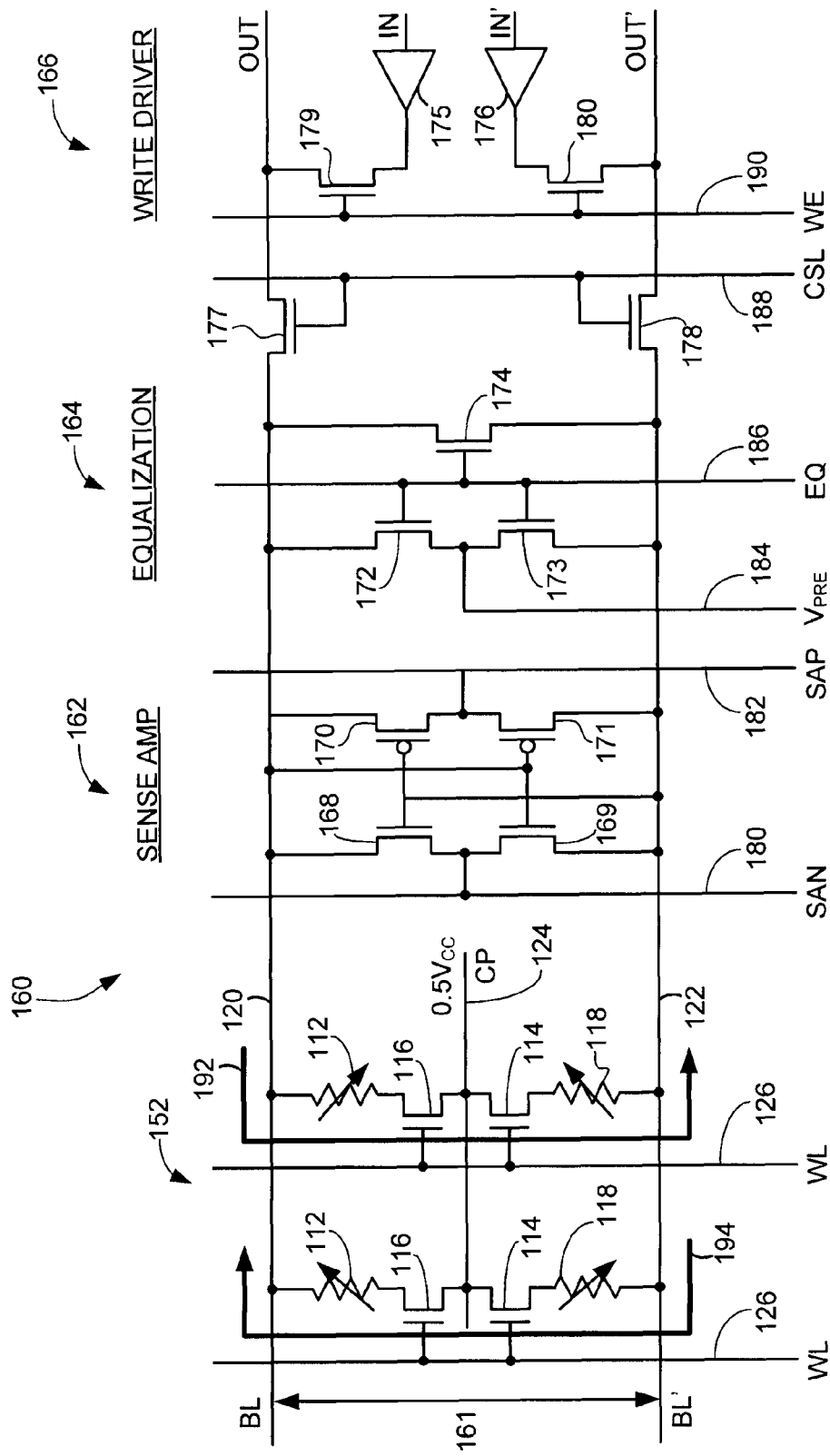
FIG. 5 provides a schematic depiction of control circuitry in accordance with various embodiments to carry out write and read operations on the memory cells of FIG. 4.

FIG. 5 shows control circuitry 160 used during write and read operations upon the memory cells 110 in accordance with various embodiments. A separate set of the control circuitry 160 in FIG. 5 can be provided for each column, and will fit within the 2T2R width 161 of the associated column. For clarity, it will be contemplated that the circuitry 160 in FIG. 5 is coupled to the memory cells 110 in column 152 in FIG. 4.

The control circuitry 160 includes a sense amplifier 162, an equalization circuit 164 and a write circuit 166. The sense amplifier 162 is utilized during read operations and includes n-channel switching devices (transistors) 168, 169 and p-channel switching devices (transistors) 170, 171 cross-connected as shown. The equalization circuit 164 provides voltage equalization prior to a read operation and includes transistors 172, 173 and 174. The write driver 166 is utilized to write the complementary states to the memory cells 110 and includes complementary driver circuits 175, 176 and four switching transistors 177, 178, 179 and 180.

A number of control signals are supplied to or from the circuitry 160 during respective write and read operations. These signals include sense amplifier differential outputs SAP and SAN via lines 180, 182; a bit line precharge $V_{PRE}$ signal via path 184; an equalization enable EQ signal via line 186; a current select CSL signal via line 188; and a write enable WE signal via line 190. A corresponding timing diagram 200 for selected ones of these signals is set forth in FIG. 6.

Figure 6:
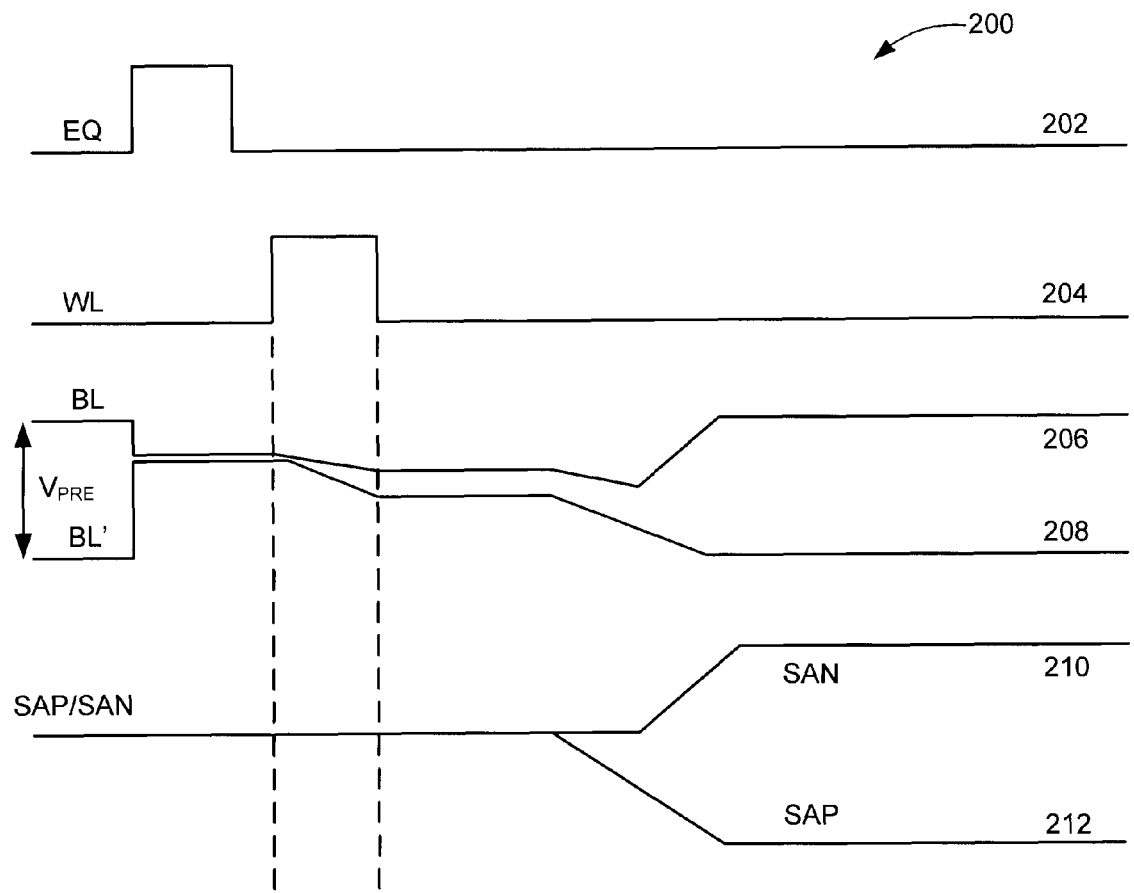
FIG. 6 is a timing diagram corresponding to the control circuitry of FIG. 5.

During a read operation, the bit lines BL, BL' 120, 122 are precharged to the $V_{PRE}$ voltage level. This can be carried out by supplying the $V_{PRE}$ voltage to line 184 and asserting the EQ signal, as shown in FIG. 6 at 202. The cell plate CP line 124 is set to an appropriate voltage $V_{CP}$, such as $0.5V_{CC}$ where $V_{CC}$ is a selected source voltage level (such as about +3.0V). The precharge voltage $V_{PRE}$ will be less than $V_{CC}$ and greater than $V_{CP}$ (i.e., $V_{CC} > V_{PRE} > 0.5V_{CC}$).

The associated word line WL 126 for the selected memory cell 110 to be read is asserted high (204 in FIG. 6), which allows the charge stored on the bit lines BL, BL' to begin discharging through the respective RMEs 112, 114 of the selected cell to the CP line 124. Because the respective resistances of the RMEs 112, 114 will be different (e.g., one high and one low), the speed of discharge from the respective bit lines BL, BL' will be different.

Upon deassertion of the word line WL 126 and activation of the SAP and SAN via lines 180 and 182, the sense amplifier 162 will initiate sensing of the differential voltages of the bit lines BL, BL' as exemplified at 206 and 208 in FIG. 6. These voltages will indicate the stored state of the memory cell 110. For example, if the programmed resistance of the first RME 112 is higher than that of the second RME 114, the BL' will discharge at a greater rate than the BL, so that the voltage on the BL will be greater than that of the BL' when the WL is deasserted.

The bit line differential voltages will be respectively outputted and will indicate the stored state of the memory cell 110 (see signals 206, 208 in FIG. 6). The foregoing read operations can be simultaneously carried out for each memory cell 110 along a selected row 156 (FIG. 4), allowing simultaneous page-mode reading and latching of the contents of each row (page) in the array.

To write a selected memory state to the selected cell 110, the WL 126 for the selected cell is asserted high. The CSL and WE signals on lines 188, 190 are also asserted high, allowing bipolar write currents 192 and 194 to be respectively supplied by the driver circuits 175, 176 through the selected cell 110. A first direction of write current can be from the BL 120 to the BL' 122, and an opposing, second direction of write current 194 can be from the BL' 122 to the BL 120.

In some embodiments the first write current from BL to BL' can operate to concurrently set the first RME 112 to a first programmed state (such as the parallel, low resistance state) and the second RME 114 to a second programmed state (such as the anti-parallel, high resistance state). The second write current from BL' to BL can correspondingly operate to concurrently set the first RME 112 to a second programmed state (such as the anti-parallel, high resistance state) and the second RME to the first programmed state (such as the parallel, low resistance state).

As can be appreciated by one skilled in the art, the various embodiments illustrated herein provide a number of advantages over the prior art, including higher sensing margin, self-referenced read sensing, smaller total semiconductor (chip) area, and faster readout via page-mode reading. It will be appreciated that the various embodiments discussed herein have numerous potential applications and are not limited to a certain field of electronic media or type of data storage devices.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A non-volatile memory array comprising a first non-volatile memory cell connected between first and second bit lines that define a first column and a second non-volatile memory cell connected between third and fourth bit lines that define a second column, each non-volatile memory cell comprising first and second resistive memory elements (RMEs) configured to concurrently store different programmed resistive states in response to application of a common write current in a selected direction through the first and second RMEs of the first non-volatile memory cell, wherein the first and second columns each have a write circuit capable of generating the common write current in opposite directions through the respective first and second columns.

2. The non-volatile memory array of claim 1, wherein the first non-volatile memory cell stores a first logical state responsive to the first RME being programmed to the first resistive state and the second RME being programmed to the second resistive state, and wherein the second non-volatile memory cell stores a second logical state responsive to the first RME being programmed to the second resistive state and the second RME being programmed to the first resistive state.

3. The non-volatile memory array of claim 1, further comprising first and second switching devices connected between the first and second RMEs and concurrently activated by a word line.

4. The non-volatile memory array of claim 3, wherein a cell plane connection is provided between the first and second transistors, and wherein charge is respectively discharged from the complementary bit lines to the cell plane during a read operation upon the first non-volatile memory cell.

5. The non-volatile memory array of claim 1, wherein the first and second RMEs are each characterized as a magnetic tunneling junction (MTJ) comprising a reference layer of fixed magnetic orientation and a free layer of variable magnetic orientation selected in relation to a direction of the common write current flow through the respective MTJ.

6. The non-volatile memory array of claim 1, wherein the first and second RMEs are each characterized as a resistive random access memory (RRAM) element.

7. The non-volatile memory array of claim 1, wherein the respective programmed states of the first and second RMEs are sensed by precharging the first and second bit lines to a selected precharge voltage $V_{PRE}$ with the equalization circuit, and discharging charge from said bit lines through the respective first and second RMEs at respective rates corresponding to the programmed resistive states of said RMEs.

8. The non-volatile memory array of claim 1, in combination with a control circuit coupled to the first non-volatile memory cell which writes a selected memory state to the first non-volatile memory cell by setting the first RME to a selected resistive state and the second RME to a different selected resistive state responsive to application of the common write current through the cell.

9. The non-volatile memory array of claim 8, wherein the control circuit further reads the selected memory state of the first non-volatile memory cell by discharging charge from the first and second bit lines through the respective first and second RMEs at different rates.

10. A method comprising:
providing a non-volatile memory array with a first non-volatile memory cell connected in a first column and a second non-volatile memory cell connected in a second column, each memory cell comprising multiple resistive memory elements (RMEs) configured to concurrently store complementary programmed resistive states;
applying a first common bidirectional write current through the first non-volatile memory cell with a first write circuit connected within the first column to concurrently program a first RME to a first resistive state and a second RME to a complementary second resistive state; and
applying a second common bidirectional write current through the second non-volatile memory cell with a second write circuit connected within the second column to concurrently program a third RME to the first resistive state and a fourth RME to the complementary second resistive state.

11. The method of claim 10, wherein the first non-volatile memory cell stores a first logical state responsive to the first RME being programmed to the first resistive state and the second RME being programmed to the second resistive state, and wherein the second non-volatile memory cell stores a second logical state responsive to the first RME being programmed to the second resistive state and the second RME being programmed to the first resistive state.

12. The method of claim 10, wherein the first non-volatile memory cell of the providing step further comprises first and second switching devices connected between the first and second RMEs, the first and second switching devices having control gates connected to a common word line, wherein assertion of the word line places each of the first and second switching devices in a conductive state.

13. The method of claim 10, further comprising a step of carrying out a read operation upon the first non-volatile memory cell by sensing respective rates of discharge of charge from the first and second bit lines through the respective first and second RMEs to a cell plane connection disposed between the first and second RMEs.

14. The method of claim 10, wherein the first and second RMEs of the providing step are each characterized as a magnetic tunneling junction (MTJ) comprising a reference layer of fixed magnetic orientation and a free layer of variable magnetic orientation selected in relation to a direction of write current flow through the respective MTJ.

15. The method of claim 10, wherein the first and second bidirectional common write currents of the applying steps respectively passes through the first and second non-volatile memory cells by respectively passing between the first and second bit lines and the third and fourth bit lines.

16. The method of claim 10, wherein the first non-volatile memory cell of the providing step is characterized as a complementary 2T2R structure.

17. A non-volatile memory cell array comprising first and second columns each having a common column width between respective bit lines, each of the first and second columns further having a memory cell, read circuit, write circuit, and equalization circuit connected between the associated bit lines, each memory cell comprising multiple resistive memory elements (RMEs) configured to concurrently store complementary programmed resistive states responsive to bidirectional currents generated, applied to the associated bit lines, and passed through the RMEs by the write circuit.

18. The array of claim 17, wherein each equalization circuit has first, second, and third transistors connected to a common equalization line that concurrently activates a gate in each transistor, a precharge line disposed between the first and second transistor providing a precharge voltage that is distributed to the respective bit lines.

19. The array of claim 17, wherein the first column activates a first equalization circuit to precharge bit lines of the first column while the second column activates a first write circuit to program a first and second RME connected within the second column.

20. The array of claim 19, wherein the first column subsequently activates a first read circuit to sense a resistive state from a third and fourth RME connected within the first column while the second column activates a second read circuit to sense a resistive state from the first and second RME.

* * * * *